United States Patent [19]
Hinrichsmeyer et al.

[11] Patent Number: 4,996,587
[45] Date of Patent: Feb. 26, 1991

[54] INTEGRATED SEMICONDUCTOR CHIP PACKAGE

[75] Inventors: Kurt Hinrichsmeyer, Sindelfingen; Werner Straehle, Dettenhausen, both of Fed. Rep. of Germany; Gordon A. Kelley, Jr., Essex Junction; Richard W. Noth, Fairfax, both of Vt.

[73] Assignee: International Business Machines Corporation, Armonk, N.Y.

[21] Appl. No.: 498,134

[22] Filed: Mar. 23, 1990

[30] Foreign Application Priority Data

Apr. 10, 1989 [DE] Fed. Rep. of Germany ....... 3911711

[51] Int. Cl.$^5$ ..................... H01L 23/02; H01L 23/12
[52] U.S. Cl. ....................................... 357/74; 357/72; 357/71; 357/75
[58] Field of Search ..................... 357/74, 70, 69, 71

[56] References Cited
U.S. PATENT DOCUMENTS 3,877,064 4/1975 Scheingold et al. ................. 357/74
4,538,210 8/1985 Schaller ............................. 357/69

Primary Examiner—Andrew J. James
Assistant Examiner—Carl Whitehead, Jr.
Attorney, Agent, or Firm—Francis J. Thornton

[57] ABSTRACT

A semiconductor package utilizing a carrier with substantially parallel top and bottom surfaces having a recess in the bottom surface and a slot in the top surface communicating with the recess in the bottom surface and provided with electrical conductors on its top surface is provided with an integrated semiconductor chip having a major surface and contact pads on the major surface in the recess of the carrier, with said contact pads positioned in the region of said slot so that the contact pads can be connected by lead wires passing through said slot, to the conductors on the top side of the carrier. The active surface of the chip containing the contact pads is encapsulated but the back surface of the chip and carrier is left exposed to improve the thermal characteristics of the chip while maintaining a low package profile.

9 Claims, 4 Drawing Sheets

INTEGRATED SEMICONDUCTOR CHIP PACKAGE

BACKGROUND OF THE INVENTION

This invention is directed toward an integrated semiconductor chip package and more particularly a package adapted to be stacked.

Currently marketed integrated semiconductor chip packages, such as the plastic encapsulated dual in-line package (DIP) when stacked on a printed circuit board as might be installed in a computer takes an inordinate amount of space and can fail because of high thermal considerations due to the fact that the chip is totally enclosed in a relatively thick plastic package. A reduction in the overall height of the individual packages would permit an increase in memory and lowering of the space requirements for a more powerful computer while simultaneously reducing some of the thermal aspects which have in the past lead to deterioration of such stacked chip packages.

IBM Technical Disclosure Bulletin, Vol. 8, No. 10, March 1966, page 1314, shows a package which uses a multilevel ceramic carrier with conductors therein and a recess on one side accommodating the semiconductor chip which is connected by the conductors in the ceramic layers to the opposite side of the carrier. The carrier side with the recess is provided with a thin metal foil to improve the cooling properties of the circuit. The chip carrier described in the above-mentioned article is complicated to produce and very expensive because of the multilayered ceramic configuration and is particularly unsuitable for use with memory chips. Additionally, connection of the inverted chip is relatively difficult and requires special fixtures.

Also known are plastic molded (DIP) packages such as shown in U.S. Pat. No. 4,862,245, assigned to the same assignee as the present invention. Such (DIP) packages, too, have disadvantages in that the encapsulation they use is relatively thick and thus limits the number that can be conveniently stacked on a memory card.

Therefore, it is desirable to provide packages of minimum thickness and good thermal qualities whose production can be simplified.

SUMMARY OF THE INVENTION

This problem is solved by a package configuration which uses a chip carrier having substantially parallel top and bottom surfaces and having a recess in the bottom surface. This recess is open to the upper surface via a slot. The chip is positioned in the recess so that its contact pads are aligned with the slot in the upper surface. The configuration of the slot is, of course, dependent upon the configuration of the contact pads on the chip.

Electrical conductors can be provided on both surfaces of the chip carrier. These conductors can be connected to the chip pads by any suitable connecting means such as bonded wire leads or so-called TAB (Tape Automated Bonding) tapes. The chip itself desirably is retained in the recess by a suitable adhesive. By leaving the back surface of the chip exposed to the ambient better cooling is realized. To prevent damage to the lead wires and to the electrical connections disposed on the upper surface of the carrier the top surface of the carrier is sealed with any suitable sealing material such as an epoxy.

Further advantages will be seen in the following description of the preferred embodiment of the invention taken in conjunction with reference to the accompanying drawings in which:

DETAILED DESCRIPTION OF THE INVENTION

Figure 1:
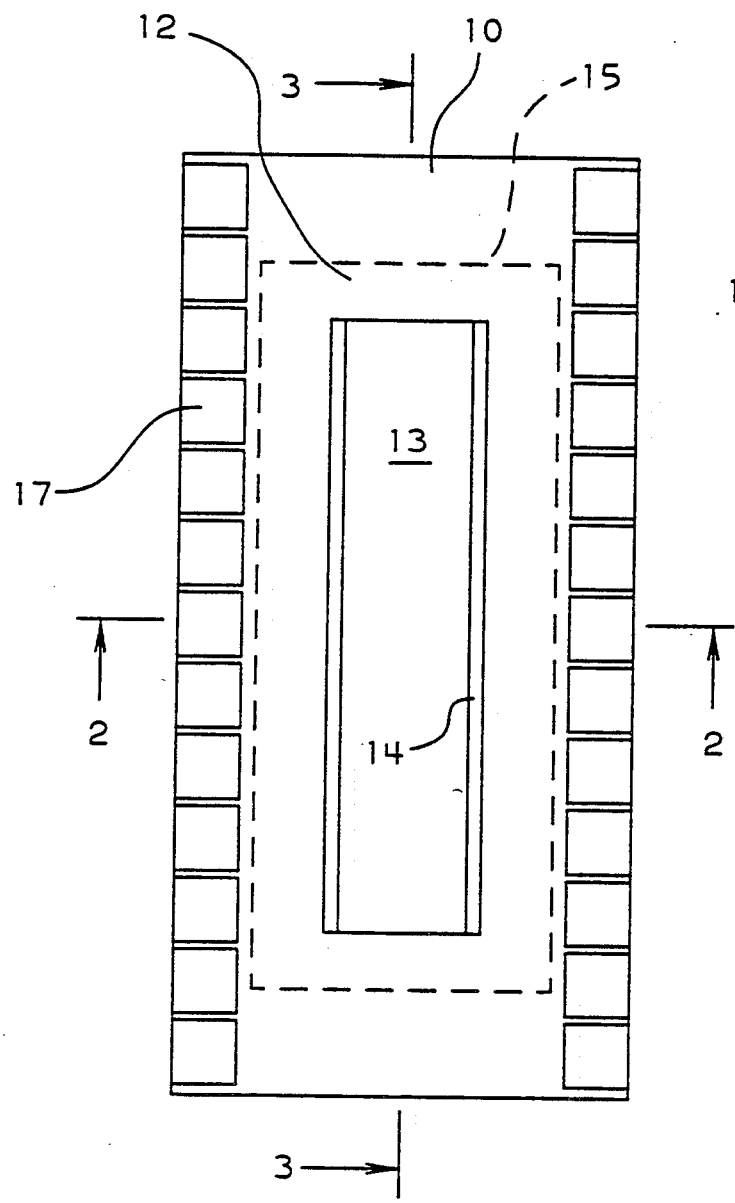
FIG. 1 is a plan view of the chip carrier utilizing a single slot.
Figure 3:
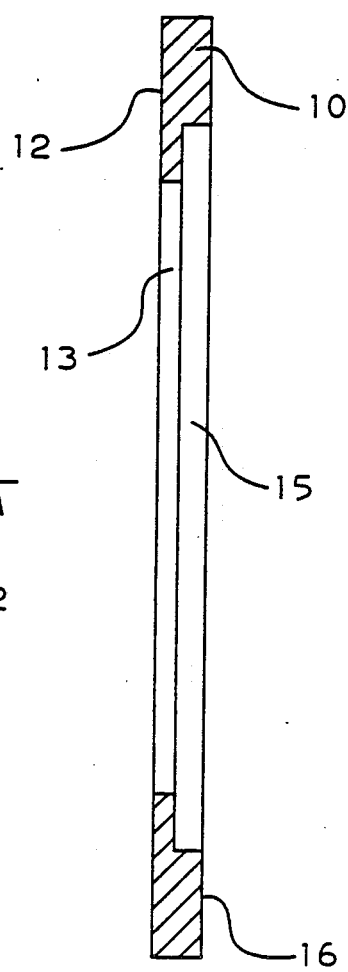
FIG. 3 is a cross-sectional view taken along the lines 3—3 of FIG. 1.
Figure 2:
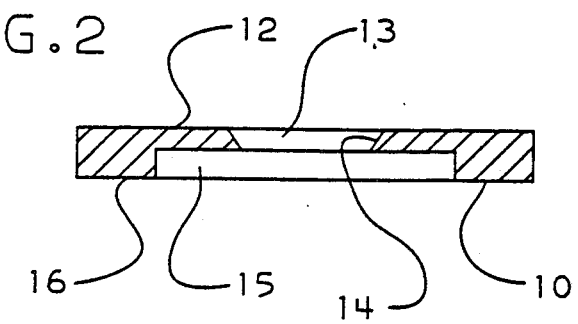
FIG. 2 is a cross-sectional view taken along the lines 2—2 of FIG. 1.

FIGS. 1, 2, 3, 4 and 5 show a chip carrier 10 having a upper surface 12 and a parallel bottom surface 16. The upper surface 12 is provided with a slot 13 therein. The bottom surface 16 is provided with a recess 15 for the accommodation of a semiconductor chip 19 therein. The chip carrier 10 as shown in these figures is generally rectangular and has a single slot 13 adapted to a accommodate a rectangular chip 19 having centrally disposed rows of contact pads 21 thereon. Of course, it should be understood that other chip configurations can be accommodated and the shape of the carrier as well as the configuration of the slot 13 can be designed to conform to the chip and pad configuration being utilized.

If desired, the slot 13 may have its edges 14 beveled to prevent sharp edges where the wires 22, joining the chip pads 21 to the conductors 18 cross. The chip carrier 10 is preferably made of a reinforced polyimide or ceramic material. Desirably, the chip carrier has a thickness of 0.8 to 1.2 millimeters and the depth of the recess 15 may range from 0.2 to 0.5 millimeters depending upon the thickness of the chip used therein.

Figure 4:
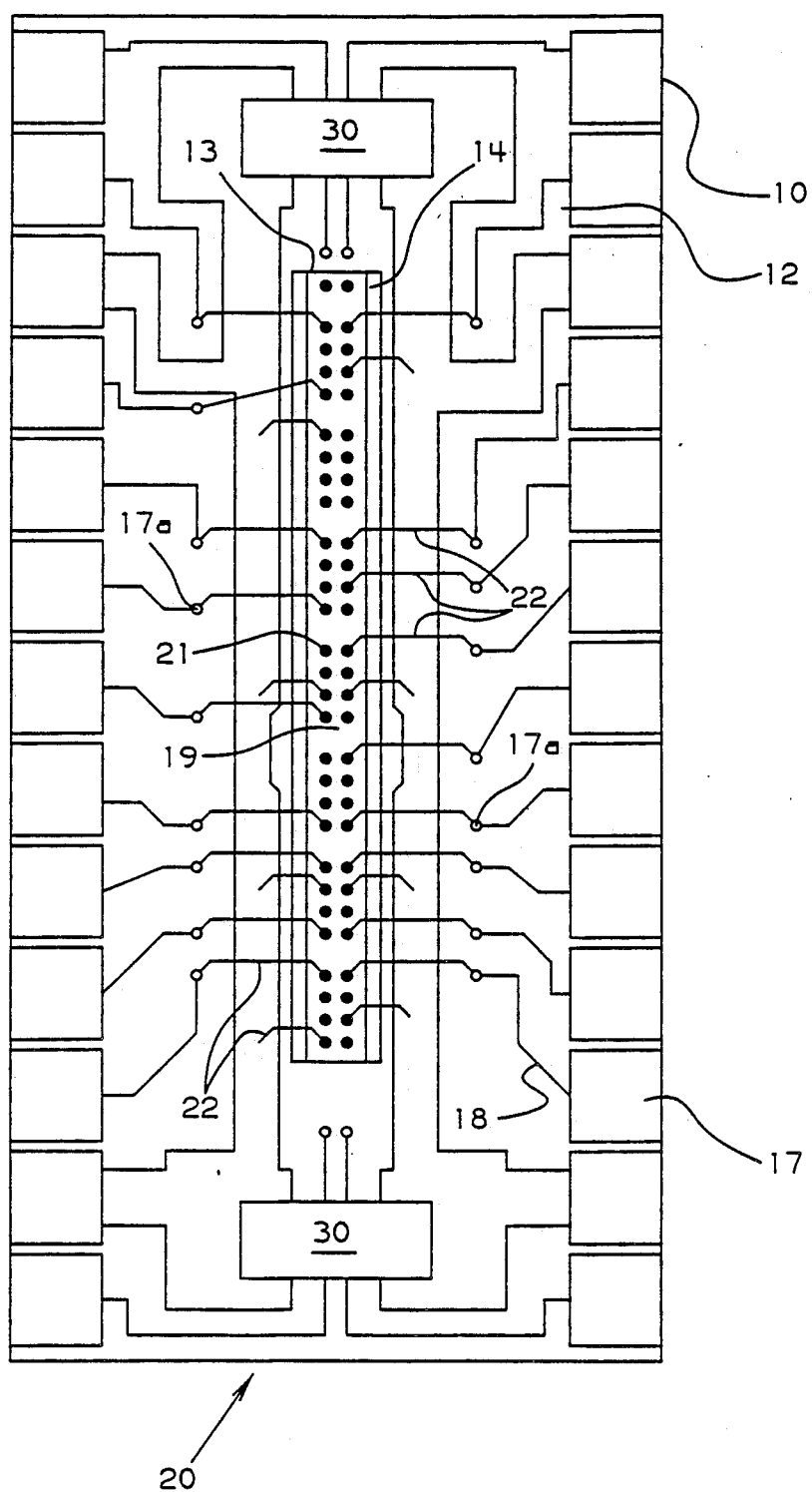
FIG. 4 is a plan view of a chip carrier having wiring on its surface and containing a chip within its recess.
Figure 5:
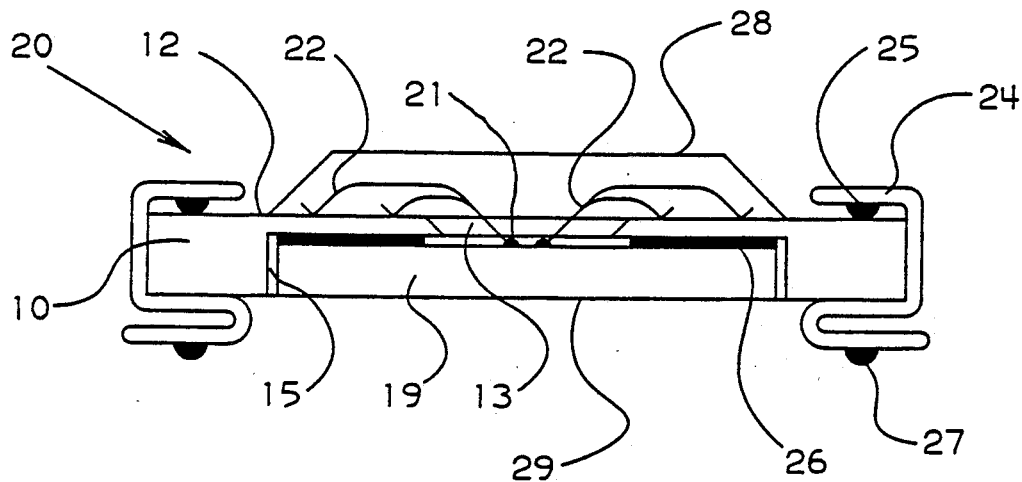
FIG. 5 is a cross-sectional view of the carrier of FIG. 4 taken upon the lines 5—5.

As particularly shown in FIGS. 4 and 5, the chip carrier 10 has the chip 19 contained in the recess 15. The chip 19 is retained in the recess 15 by a suitable adhesive 26. On the top side 12 of the chip carrier 10 conductors 18 are arranged. Such conductors can be formed, for example, by evaporation or sputtering or other suitable process. The bottom side 16 of the chip carrier 10 may also be provided with conductors (not shown). The conductors 18 extend between external card connection means 17 and bonding areas 17a. The lead wires 22 connect the chip contact pads 21, disposed on the surface of the chip and exposed in the slot region 13, to the bonding areas 17a. If desired, discrete components such as coupling capacitors 30 may also be disposed on the surface of the chip carrier 10.

Once the appropriate wires 22 have been bonded between the chip pads 21 and the connection pads 17a an encapsulation material 28 is placed over the surface of the chip carrier so as to cover the bonding wires 20 and their connection point 17a and the chip connection pads 21. This encapsulation material may be any suitable polyimide or plastic encapsulant material as is known in the art.

It should be noted that the backside 29 of chip 19 is located on the same plane as the bottom side of the carrier. In this way the chip is fully protected by the recess in the carrier while still permitting the back surface 29 of the chip to remain free so that the chip can be adequately cooled by air flowing over the back surface 29.

At this time the S shaped connector clips 24 are bonded via solder pellets 21 to the card connection means 17 on the edge of the carrier 10. These clips 24 are provided with solder pads 27 on their bottom side so that the units may be secured by normal soldering techniques to a printed circuit card or the like.

Figure 6:
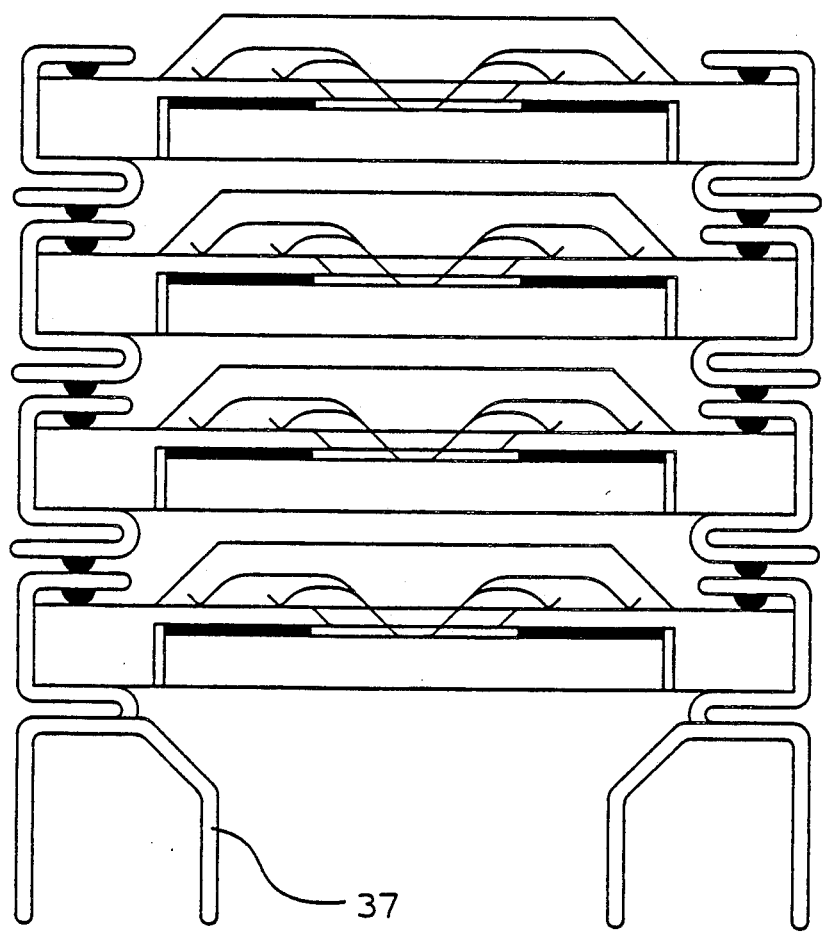
FIG. 6 is a cross-sectional view of a stack of the packages of FIG. 5.

As shown in FIG. 6, the module units described in FIG. 4 and 5 may be stacked and the S clips 24 are bonded to the carrier lying beneath it. The bottom most module may be provided with pins 37 which permit the entire stack to be plugged into a printed circuit card. Of course this pin arrangement can be eliminated if the stack is to be soldered to the surface of the card. In such a case the bottom most carrier of the stack shown in FIG. 6 would be provided with a solder connection 27 as shown in FIG. 5 in place of the pins 37.

Figure 7:
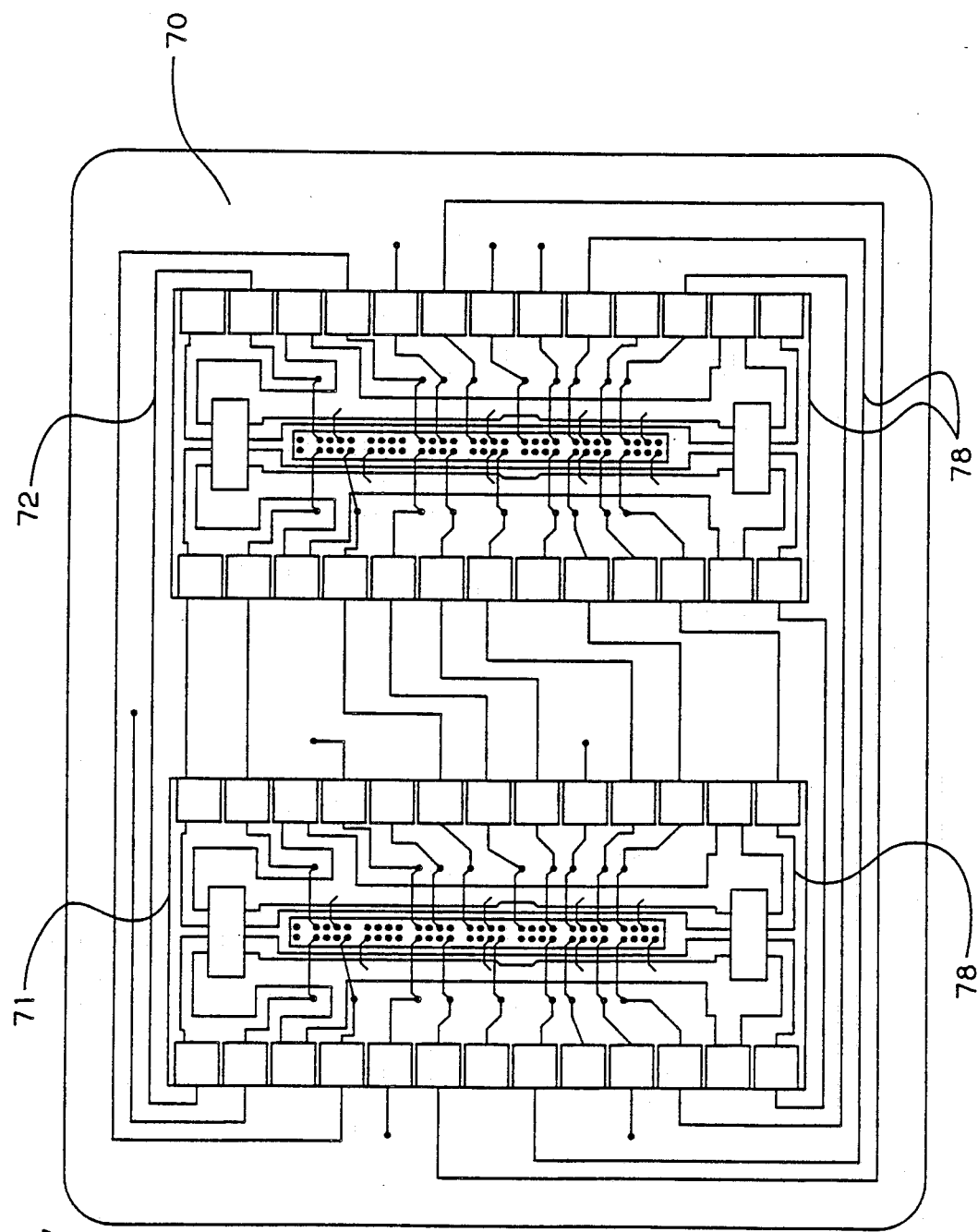
FIG. 7 is a plan view of a dual chip carrier.

FIG. 7 is a plan view of a card carrier 70 provided with two adjacent chips 71 and 72 connected by suitable connectors 78 on the surface thereof. These connectors 78 may be arranged on the surfaces or between the laminates as discussed in previously.

The chips 71 and 72 in the carriers may be identical or may differ, that is, for example, one may be a processor and the other a memory chip or, for example, it could be a memory chip and a logic chip. The carrier 70 is made of the same material as the chip carriers discussed above.

Although a preferred embodiment and selected modifications of the invention have been disclosed and described it is apparent that other embodiments and modifications of the invention are possible, therefore the invention is to limited only by the scope of the appended claims, wherein

We claim:
1. A semiconductor package comprising:
a chip carrier with substantially parallel top and bottom surfaces,
a recess in the bottom surface,
at least one slot in the top surface substantially smaller than said recess communicating with the recess in the bottom surface,
electrical conductors arranged at least on the top surface of said carrier,
in integrated semiconductor chip having a major surface and contact pads on said major surface arranged in the recess of said carrier with said contact pads positioned in the region of said slot, and
lead wires passing through said lot in connecting the contact pads on the chip to the conductors on the top side of the carrier.

2. The package of claim 1 wherein the backside of the chip and the bottom surface of the carrier lie in the same plane.

3. The package of claim 2 wherein the slot edges are beveled.

4. The package of claim 3 wherein the carrier with the embedded chip has a thickness of 0.8 to 1.2 millimeters and the thickness of the carrier in the region of the recess is 0.2 to 0.5 millimeters.

5. The package as claimed in claim 4 wherein the carrier is made of reinforced polyimide.

6. The package of claim 4 wherein the carrier is made of ceramic material.

7. The package of claim 4 wherein passive and active components are arranged on the carrier top surface.

8. A stack of packages wherein each package comprises
a chip carrier with substantially parallel top and bottom surfaces,
a recess in the bottom surface,
at least one slot in the top surface substantially smaller than said recess communicating with the recess in the bottom surface,
electrical conductors arranged at least on the top surface of said carrier,
an integrated semiconductor chip having a major surface and contact pads on said major surface arranged in the recess of said carrier with said contact pads positioned in the region of said slot, and
lead wires passing through said slot in connecting the contact pads on the chip to the conductors on the top side of the carrier.

9. A semiconductor package comprising:
a chip carrier with substantially parallel top and bottom surfaces,
at least two recesses in the bottom surface,
at least two slots in the top surface of said carrier, each slot communicating with a respective recess in the bottom surface,
electrical conductors arranged on the top surface of said carrier,
an integrated semiconductor chip having a major surface and contact pads on said major surface arranged in each recess in said carrier, the contact pads of the respective chip in the recess positioned in the region of the slot communicating with the recess,
lead wires passing through each said slot and connecting the contact pads on each said chip to the conductors on the top side of the carrier.

* * * * *